(12) United States Patent
Fukuyo et al.

(10) Patent No.: US 8,890,027 B2
(45) Date of Patent: Nov. 18, 2014

(54) LASER PROCESSING METHOD AND LASER PROCESSING SYSTEM

(75) Inventors: Fumitsugu Fukuyo, Hamamatsu (JP); Etsuji Ohmura, Hirakata (JP); Kenshi Fukumitsu, Hamamatsu (JP); Masayoshi Kumagai, Hamamatsu (JP); Kazuhiro Atsumi, Hamamatsu (JP); Naoki Uchiyama, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 529 days.

(21) Appl. No.: 12/282,698

(22) PCT Filed: Mar. 6, 2007

(86) PCT No.: PCT/JP2007/054296
§ 371 (c)(1),
(2), (4) Date: Feb. 3, 2009

(87) PCT Pub. No.: WO2007/105537
PCT Pub. Date: Sep. 20, 2007

(65) Prior Publication Data
US 2009/0236324 A1 Sep. 24, 2009

(30) Foreign Application Priority Data
Mar. 14, 2006 (JP) ................ P2006-069985

(51) Int. Cl.
*B23K 26/38* (2014.01)
*B23K 26/00* (2014.01)
*B23K 26/06* (2014.01)
*B23K 26/36* (2014.01)

(52) U.S. Cl.
CPC .......... *B23K 26/0057* (2013.01); *B23K 26/063* (2013.01); *B23K 26/367* (2013.01)
USPC ...................... 219/121.72; 219/67

(58) Field of Classification Search
USPC ............. 219/121.67, 121.68, 121.7, 219/121.71–121.77, 121.83, 121.84; 359/245–289
See application file for complete search history.

(56) References Cited

U.S. PATENT DOCUMENTS

| | | | |
|---|---|---|---|
| 6,992,026 B2 | 1/2006 | Fukuyo et al. | |
| 2004/0002199 A1* | 1/2004 | Fukuyo et al. | ................ 438/460 |
| 2005/0155958 A1* | 7/2005 | Arai et al. | ................ 219/121.72 |
| 2005/0202596 A1 | 9/2005 | Fukuyo et al. | |
| 2005/0226287 A1 | 10/2005 | Shah et al. | |
| 2006/0076327 A1* | 4/2006 | Kobayashi et al. | ...... 219/121.73 |

FOREIGN PATENT DOCUMENTS

| | | | | |
|---|---|---|---|---|
| JP | 2005-129607 | 5/2005 | | |
| JP | 2005-179154 | 7/2005 | | |
| JP | 2005-243977 | * 9/2005 | ............ | H01L 21/301 |
| JP | 2006-043713 | 2/2006 | | |
| JP | 2006-108478 | 4/2006 | | |
| KR | 10-2004-0093139 A | 11/2004 | | |
| WO | WO 2006/011372 A1 | 2/2006 | | |

OTHER PUBLICATIONS

K. Hayashi; "Inner Glass Marking by Harmonics of Solid-State Laser", Proceedings of $45^{th}$ Laser Materials Processing Conference, Dec. 1998, pp. 23-28.
K. Miura et al., "Formation of Photo-Induced Structures in Glasses with Femtosecond Laser", Proceedings of $42^{nd}$ Laser Materials Processing Conference, Nov. 1997, pp. 105-111.
T. Sano et al., "Evaluation of Processing Characteristics of Silicon with Picosecond Pulse Laser", Preprints of the National Meeting of Japan Welding Society, No. 66, Apr. 2000, pp. 72-73 (with at least partial English translation).

* cited by examiner

*Primary Examiner* — Thien S Tran
(74) *Attorney, Agent, or Firm* — Drinker Biddle & Reath LLP

(57) ABSTRACT

An object to be processed 1 is irradiated with laser light L with a standard pulse waveform, so as to form a molten processed region $13_1$, which has a larger size in the thickness direction of the object 1 and is easy to generate a fracture 24 in the thickness direction of the object 1, within a silicon wafer $11_1$, and with laser light L with a retarded pulse waveform, so as to form a molten processed region $13_2$, which has a smaller size in the thickness direction of the object 1 and is hard to generate the fracture 24 in the thickness direction of the object 1, within a silicon wafer $11_2$.

6 Claims, 26 Drawing Sheets

Fig.16

| PULSE WAVEFORM | HIGHEST TEMPERATURE REACHED (K) | AREA EXCEEDING MP ($\mu$m) |
|---|---|---|
| $\alpha$=0.1 | 14500 | 28.0 |
| $\alpha$=1.0 | 17000 | 27.5 |
| $\alpha$=1.9 | 9900 | 27.0 |

(a)

(b)

US 8,890,027 B2

LASER PROCESSING METHOD AND LASER PROCESSING SYSTEM

TECHNICAL FIELD

The present invention relates to a laser processing method and laser processing apparatus for cutting a planar object to be processed along a line to cut.

BACKGROUND ART

Known as a conventional technique in the field mentioned above is a wafer dividing method comprising the steps of irradiating a wafer with laser light, which is transmissible through the wafer, along a line to divide, so as to form a modified layer within the wafer along the line to divide; and then expanding an expandable protective tape attached to one surface of the wafer, so as to divide the wafer along the modified layer (see Patent Document 1, for example).
Patent Document 1: Japanese Patent Application Laid-Open No. 2005-129607

DISCLOSURE OF THE INVENTION

Problem to be Solved by the Invention

However, there are various types of planar objects to be processed which differ in terms of form, structure, material, crystal orientation, and the like, so that there are cases where modified regions different from each other in their types (size, easiness of generating fractures, and the like) should be formed within a single object to be processed in order to cut the object accurately along a line to cut.

In view of such circumstances, it is an object of the present invention to provide a laser processing method and laser processing apparatus which can reliably form modified regions whose types differ from each other within a single object to be processed.

Means for Solving Problem

The inventors conducted diligent studies for achieving the above-mentioned object and, as a result, have found that, when the object is irradiated with pulse-oscillated laser light while locating a converging point within the object, the temperature distribution in the vicinity of the converging point changes according to the pulse waveform, thereby altering types (size, easiness of generating fractures, and the like) of modified regions formed near the converging point. This is because, even when transmissible through the object, the laser light is easier to be absorbed as the temperature of the object is higher, since the absorption coefficient depends on temperature. The inventors have further conducted studies based on such a finding, thereby completing the present invention.

Namely, the laser processing method in accordance with one aspect of the present invention comprises the steps of irradiating a planar object to be processed with laser light having a first pulse waveform while locating a converging point within the object at a first position separated by a first distance in a thickness direction of the object from a laser light entrance surface of the object, so as to form a first modified region to become a cutting start point within the object along a line to cut the object; and irradiating the object with laser light having a second pulse waveform while locating a converging point within the object at a second position separated by a second distance in the thickness direction of the object from the laser light entrance surface, so as to form a second modified region to become a cutting start point within the object along the line to cut.

This laser processing method can reliably form the first and second modified regions whose types differ from each other at the first and second positions separated by the first and second distances in the thickness direction of the object from the laser light entrance surface of the object, respectively, along the line to cut.

Preferably, in this laser processing method, the object is cut along the line to cut from the first and second modified regions acting as cutting start points. This makes it possible to cut the object accurately along the line to cut.

The laser processing method in accordance with another aspect of the present invention comprises the steps of irradiating a planar object to be processed with laser light having a first pulse waveform while locating a converging point within the object, so as to form a first modified region to become a cutting start point within the object along a first line to cut the object; and irradiating the object with laser light having a second pulse waveform while locating a converging point within the object, so as to form a second modified region to become a cutting start point within the object along a second line to cut the object.

This laser processing method can reliably form the first and second modified regions whose types differ from each other within the object along the first and second lines to cut, respectively. There is a case where the first and second lines to cut intersect each other.

Preferably, in this laser processing method, the object is cut along the first and second lines to cut from the first and second modified regions acting as cutting start points. This makes it possible to cut the object accurately along the first and second lines to cut.

The laser processing apparatus in accordance with the present invention is a laser processing apparatus for forming a modified region to become a cutting start point within a planar object to be processed, the apparatus comprising a mount table for mounting the object, a laser light source for pulse-oscillating laser light, pulse waveform changing means for changing a pulse waveform of the laser light pulse-oscillated by the laser light source, and a condenser lens for converging the laser light pulse-oscillated by the laser light source into the object mounted on the mount table and forming the modified region at a converging point of the laser light.

In this laser processing apparatus, the pulse waveform of the laser light pulse-oscillated by the laser light source can be changed by the pulse waveform changing means, whereby modified regions whose types differ from each other can reliably be formed within a single object to be processed.

Effect of the Invention

The present invention can reliably form modified regions whose types differ from each other within a single object to be processed.

BRIEF DESCRIPTION OF THE DRAWINGS

FIG. 16 is a table showing the highest temperature reached and the area exceeding the melting point for each pulse waveform;

EXPLANATIONS OF NUMERALS

1 ... object to be processed; 3 ... front face; 5, $5_1$, $5_2$ ... line to cut; 7 ... modified region; 11, $11_1$, $11_2$ ... silicon wafer; 11a ... laser light entrance surface; 13, $13_1$, $13_2$ ... molten processed region; 21 ... rear face; L ... laser light; P ... converging point.

BEST MODES FOR CARRYING OUT THE INVENTION

In the following, preferred embodiments of the present invention will be explained in detail with reference to the drawings. In the laser processing method in accordance with the embodiment, a phenomenon known as multiphoton absorption also contributes to forming a modified region within an object to be processed. Therefore, to begin with, a laser processing method for forming a modified region by the multiphoton absorption will be explained.

A material becomes transparent when its absorption bandgap $E_G$ is greater than photon energy hv. Consequently, a condition under which absorption occurs in the material is hv>$E_G$. However, even when optically transparent, the material generates absorption under a condition of nhv>$E_G$ (where n=2, 3, 4, ...) if the intensity of laser light becomes very high. This phenomenon is known as multiphoton absorption. In the case of pulsed waves, the intensity of laser light is determined by the peak power density (W/cm$^2$) of laser light at its converging point. The multiphoton absorption occurs under a condition where the peak power density is 1×10$^8$ (W/cm$^2$) or greater, for example. The peak power density is determined by (energy of laser light at the converging point per pulse)/(beam spot cross-sectional area of laser light×pulse width). In the case of continuous waves, the intensity of laser light is determined by the field intensity (W/cm$^2$) of laser light at the converging point.

Figure 1:
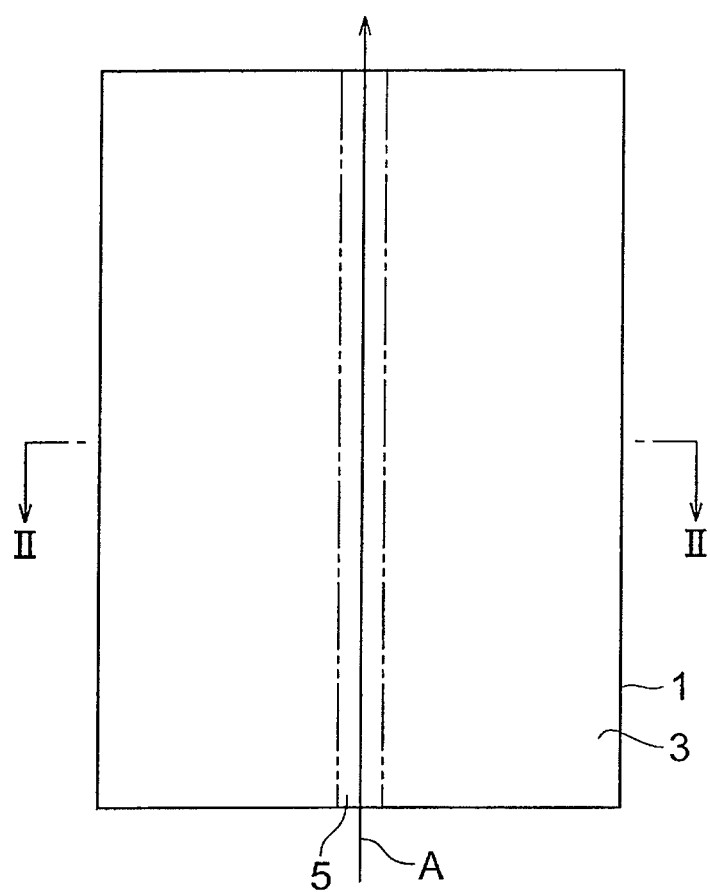
FIG. 1 is a plan view of an object to be processed during laser processing by the laser processing method in accordance with an embodiment.
Figure 2:
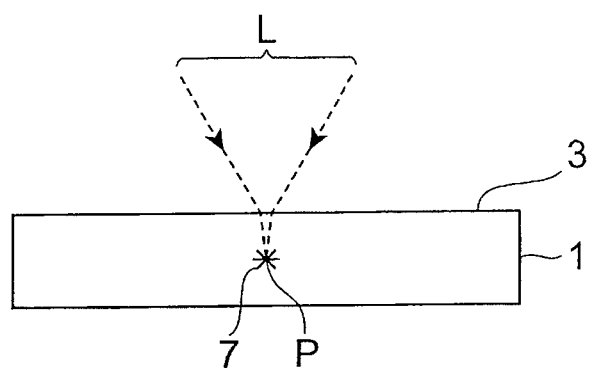
FIG. 2 is a sectional view of the object taken along the line II-II of FIG. 1.

The principle of the laser processing method in accordance with the embodiment using such multiphoton absorption will be explained with reference to FIGS. 1 to 6. As shown in FIG. 1, on a front face 3 of a wafer-shaped (planar) object to be processed 1, a line to cut 5 for cutting the object 1 exists. The line to cut 5 is a virtual line extending straight. As shown in FIG. 2, the laser processing method in accordance with this embodiment irradiates the object 1 with laser light L while locating a converging point P therewithin under a condition generating multiphoton absorption, so as to form a modified region 7. The converging point P is a position at which the laser light L is converged. The line to cut 5 may be curved instead of being straight, and may be a line actually drawn on the object 1 without being restricted to the virtual line.

Figure 3:
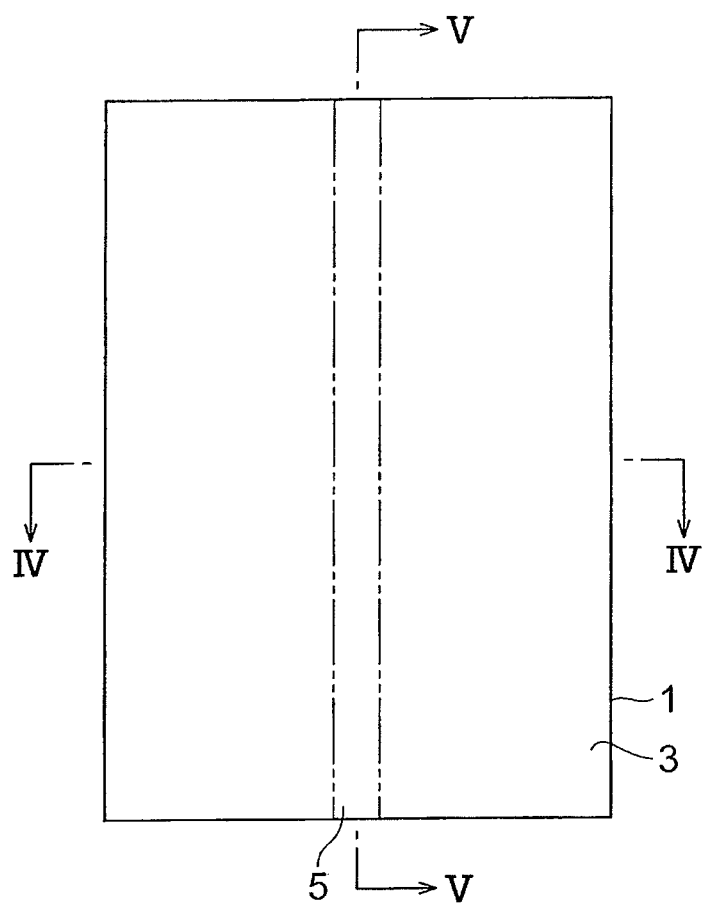
FIG. 3 is a plan view of the object after the laser processing by the laser processing method in accordance with the embodiment.
Figure 4:
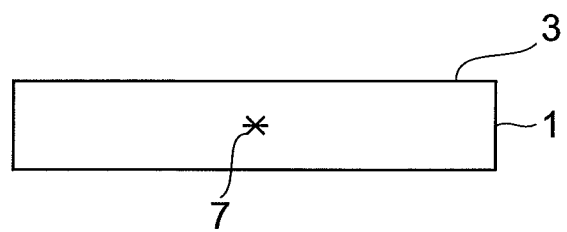
FIG. 4 is a sectional view of the object taken along the line IV-IV of FIG. 3.
Figure 5:
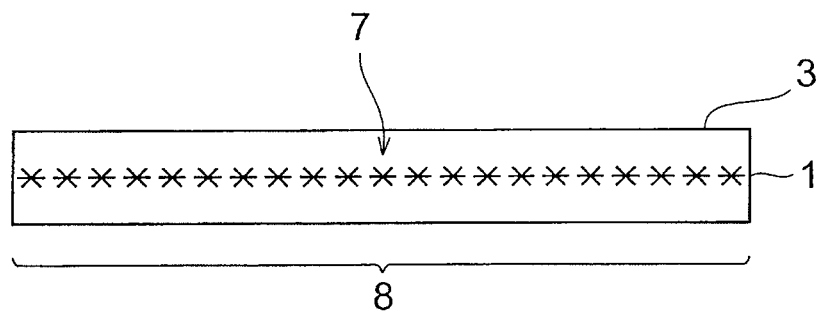
FIG. 5 is a sectional view of the object taken along the line V-V of FIG. 3.

Then, the laser light L is relatively moved along the line to cut 5 (i.e., in the direction of arrow A in FIG. 1), so as to shift the converging point P along the line to cut 5. Consequently, as shown in FIGS. 3 to 5, the modified region 7 is formed along the line to cut 5 within the object 1, and becomes a starting point region for cutting 8. The starting point region for cutting 8 refers to a region which becomes a start point for cutting (fracturing) when the object 1 is cut. The starting point region for cutting 8 may be made by forming the modified region 7 either continuously or intermittently.

In the laser processing method in accordance with this embodiment, the front face 3 of the object 1 hardly absorbs the laser light L and does not melt.

Figure 6:
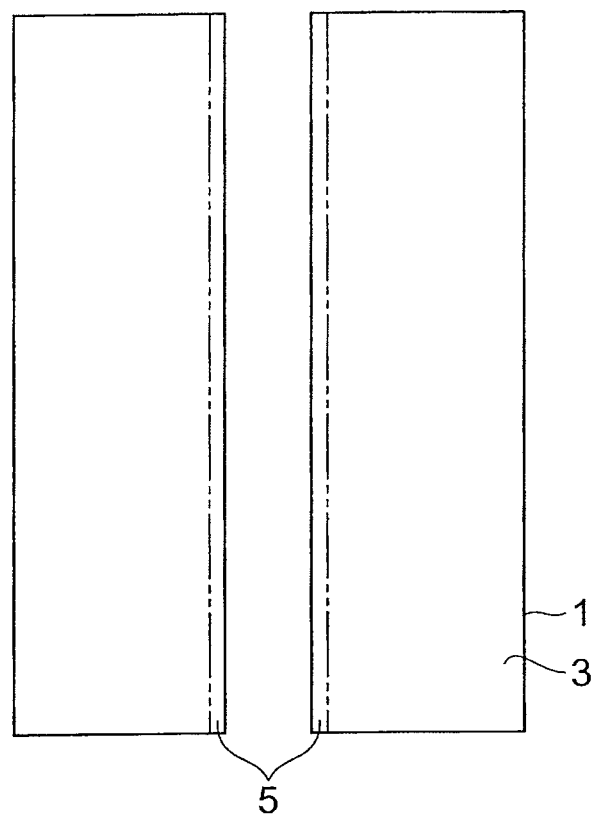
FIG. 6 is a plan view of the object cut by the laser processing method in accordance with the embodiment.

Forming the starting point region for cutting 8 within the object 1 makes it easier to generate fractures from the starting point region for cutting 8 acting as a start point, whereby the object 1 can be cut with a relatively small force as shown in FIG. 6. Therefore, the object 1 can be cut with a high precision without generating unnecessary fractures on the front face 3 of the object 1.

There seem to be the following two ways of cutting the object 1 from the starting point region for cutting 8 acting as a start point. One is where an artificial force is applied to the object 1 after the starting point region for cutting 8 is formed, so that the object 1 fractures from the starting point region for cutting 8 acting as a start point, whereby the object 1 is cut. This is the cutting in the case where the object 1 has a large thickness, for example. Applying an artificial force refers to exerting a bending stress or shear stress on the object 1 along the starting point region for cutting 8, or generating a thermal stress by applying a temperature difference to the object 1, for example. The other is where the forming of the starting point region for cutting 8 allows the object 1 to fracture naturally in its cross-sectional direction (thickness direction) from the starting point region for cutting 8 acting as a start point, thereby cutting the object 1. This becomes possible if the starting point region for cutting 8 is formed by one row of the modified region 7 when the object 1 has a small thickness, or if the starting point region for cutting 8 is formed by a plurality of rows of the modified region 7 in the thickness direction when the object 1 has a large thickness. Even in this naturally fracturing case, fractures do not extend onto the front face 3 at a portion corresponding to an area not formed with the starting point region for cutting 8 in the part to cut, so that only the portion corresponding to the area formed with the starting point region for cutting 8 can be cleaved, whereby cleavage can be controlled well. Such a cleaving method with a favorable controllability is very effective, since the object 1 such as silicon wafer has recently been apt to decrease its thickness.

The modified region in the laser processing method in accordance with the embodiment encompasses the following cases (1) to (3):

(1) Case where the Modified Region is a Crack Region Including One Crack or a Plurality of Cracks An object to be processed (e.g., glass or a piezoelectric material made of $LiTaO_3$) is irradiated with laser light while locating a converging point therewithin under a condition with a field intensity of at least $1\times10^8$ (W/cm$^2$) at the converging point and a pulse width of 1 μs or less. This magnitude of pulse width is a condition under which a crack region can be formed only within the object while generating multiphoton absorption without causing unnecessary damages to the front face of the object. This generates a phenomenon of optical damage by multiphoton absorption within the object. This optical damage induces a thermal distortion within the object, thereby forming a crack region therewithin. The upper limit of field intensity is $1\times10^{12}$ (W/cm$^2$), for example. The pulse width is preferably 1 ns to 200 ns, for example. The forming of a crack region by multiphoton absorption is disclosed, for example, in "Internal Marking of Glass Substrate with Solid-state Laser Harmonics", Proceedings of the 45th Laser Materials Processing Conference (December, 1998), pp. 23-28.

The inventors determined the relationship between field intensity and crack size by an experiment. The following are conditions of the experiment.

(A) Object to be processed: Pyrex (registered trademark) glass (with a thickness of 700 μm)

(B) Laser

Light source: semiconductor laser pumping Nd:YAG laser
Wavelength: 1064 nm
Laser light spot cross-sectional area: $3.14\times10^{-8}$ cm$^2$
Oscillation mode: Q-switched pulse
Repetition frequency: 100 kHz
Pulse width: 30 ns
Output: output<1 mJ/pulse
Laser light quality: TEMK$_{00}$
Polarizing property: linear polarization (C) Condenser lens Transmittance at a laser light wavelength: 60%

(D) Moving rate of the mount table mounting the object: 100 mm/sec

The laser light quality of TEM$_{00}$ means that the converging characteristic is so high that convergence to about the wavelength of laser light is possible.

Figure 7:
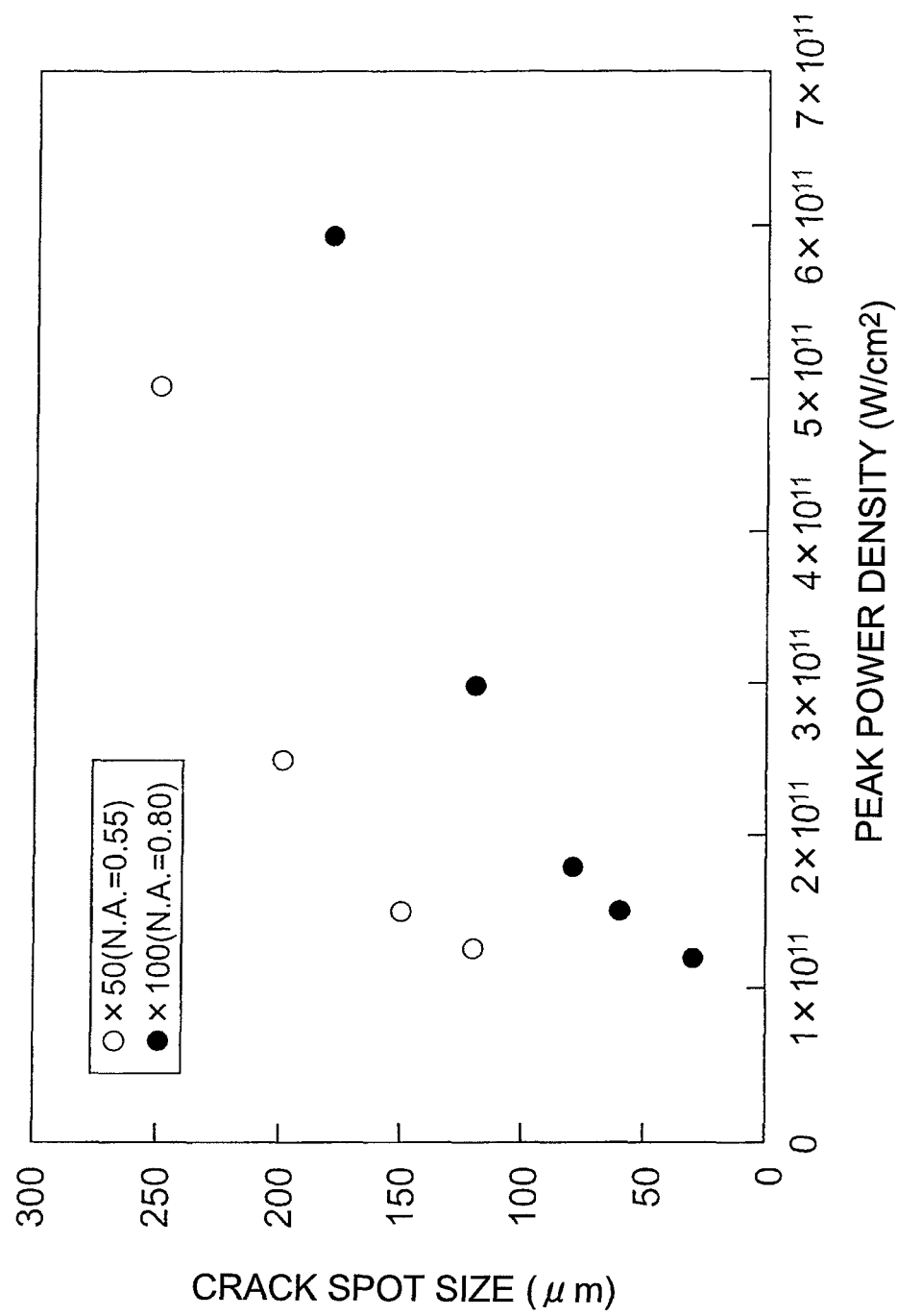
FIG. 7 is a graph showing relationships between the peak power density and crack spot size in the laser processing method in accordance with the embodiment.

FIG. 7 is a graph showing the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

Figure 8:
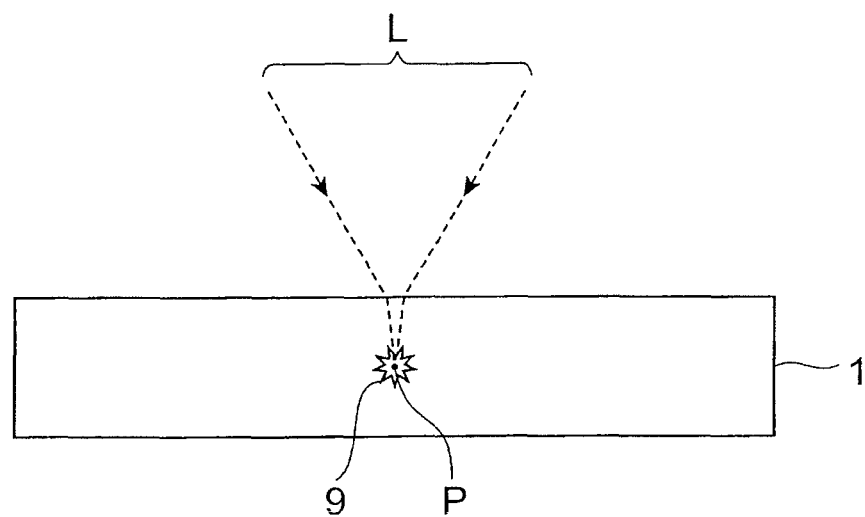
FIG. 8 is a sectional view of the object in a first step of the laser processing method in accordance with the embodiment.
Figure 9:
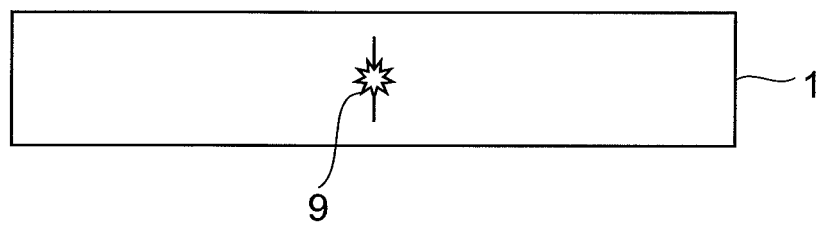
FIG. 9 is a sectional view of the object in a second step of the laser processing method in accordance with the embodiment.
Figure 10:
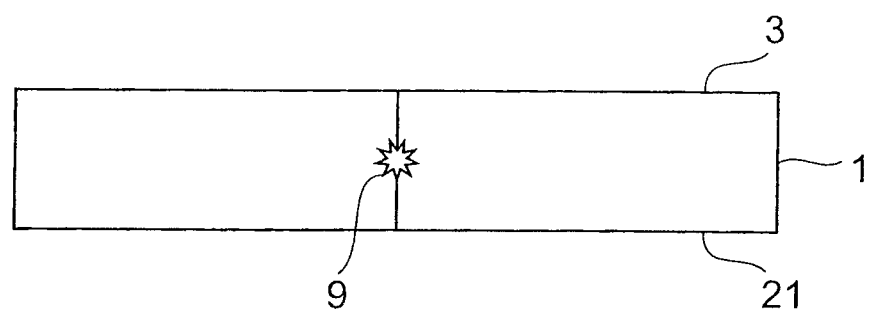
FIG. 10 is a sectional view of the object in a third step of the laser processing method in accordance with the embodiment.
Figure 11:
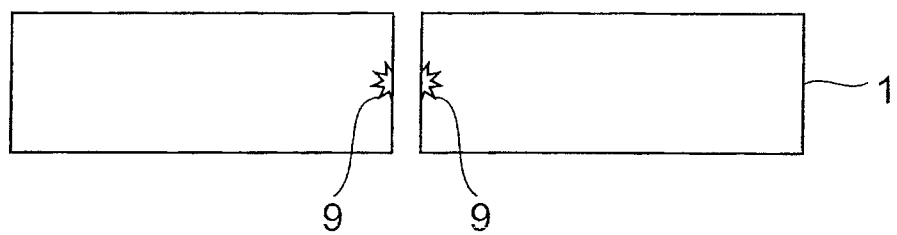
FIG. 11 is a sectional view of the object in a fourth step of the laser processing method in accordance with the embodiment.

A mechanism by which the object to be processed is cut by forming a crack region will now be explained with reference to FIGS. 8 to 11. As shown in FIG. 8, the object 1 is irradiated with laser light L while the converging point P is located within the object 1 under a condition where multiphoton absorption occurs, so as to form a crack region 9 therewithin along a line to cut. The crack region 9 is a region containing one crack or a plurality of cracks. Thus formed crack region 9 becomes a starting point region for cutting. A crack further grows from the crack region 9 acting as a start point (i.e., from the starting point region for cutting acting as a start point) as shown in FIG. 9, and reaches the front face 3 and rear face 21 of the object 1 as shown in FIG. 10, whereby the object 1 fractures and is consequently cut as shown in FIG. 11. The crack reaching the front face 3 and rear face 21 of the object 1 may grow naturally or as a force is applied to the object 1.

(2) Case where the Modified Region is a Molten Processed Region

An object to be processed (e.g., semiconductor material such as silicon) is irradiated with laser light while locating a converging point within the object under a condition with a field intensity of at least $1\times10^8$ (W/cm$^2$) at the converging point and a pulse width of 1 μs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1\times10^{12}$ (W/cm$^2$), for example. The pulse width is preferably 1 ns to 200 ns, for example.

By an experiment, the inventors verified that a molten processed region was formed within a silicon wafer. The following are conditions of the experiment.

(A) Object to be processed: silicon wafer (with a thickness of 350 µm and an outer diameter of 4 inches)

(B) Laser
Light source: semiconductor laser pumping Nd:YAG laser
Wavelength: 1064 nm
Laser light spot cross-sectional area: $3.14\times10^{-8}$ cm$^2$
Oscillation mode: Q-switched pulse
Repetition frequency: 100 kHz
Pulse width: 30 ns
Output: 20 µJ/pulse
Laser light quality: TEM$_{00}$
Polarizing property: linear polarization (C) Condenser lens
Magnification: ×50
N.A.: 0.55
Transmittance at a laser light wavelength: 60%

(D) Moving rate of the mount table mounting the object: 100 mm/sec

Figure 12:
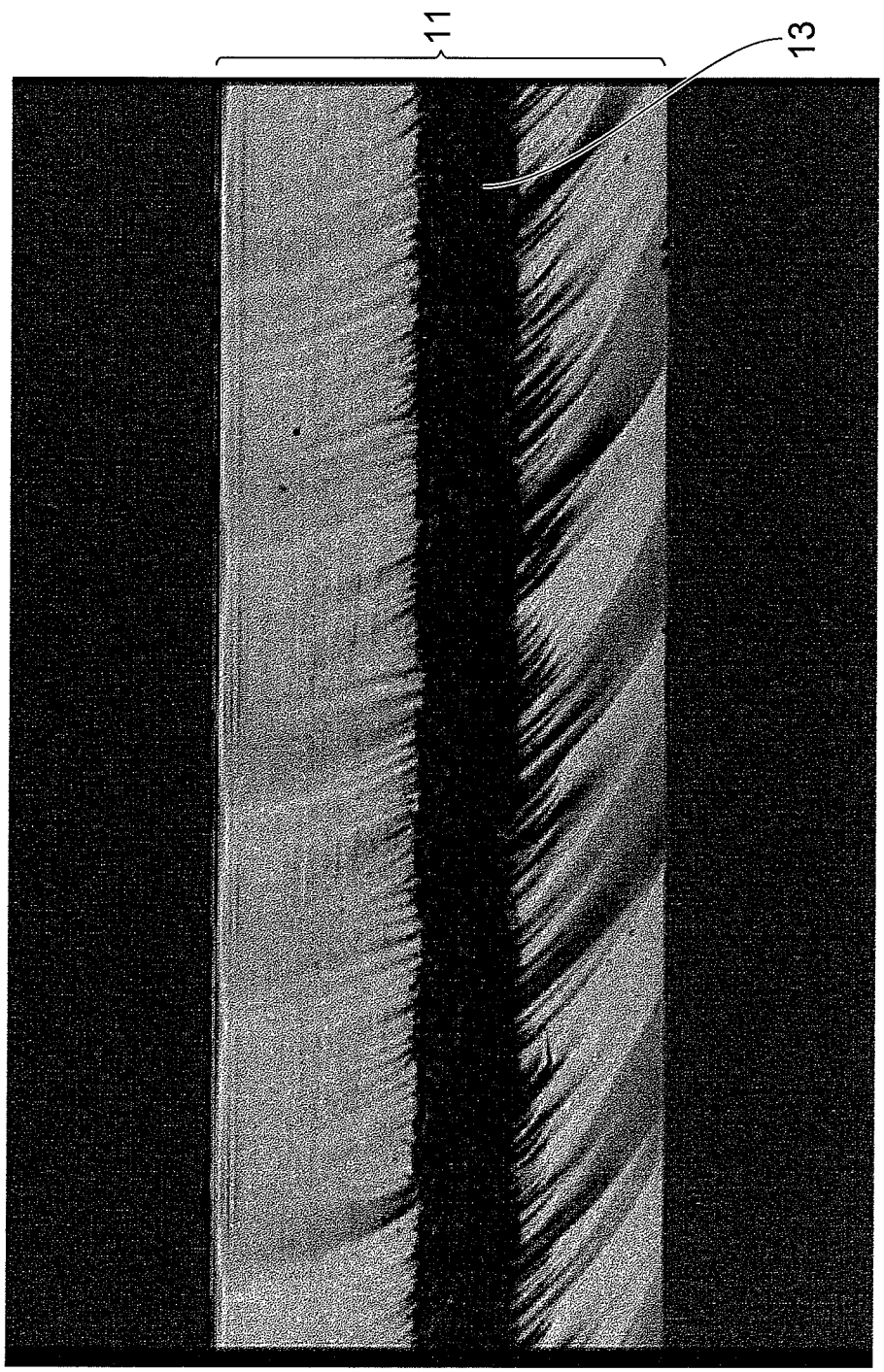
FIG. 12 is a view showing a photograph of a cut section in a part of a silicon wafer cut by the laser processing method in accordance with the embodiment.

FIG. 12 is a view showing a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 µm in the thickness direction.

Figure 13:
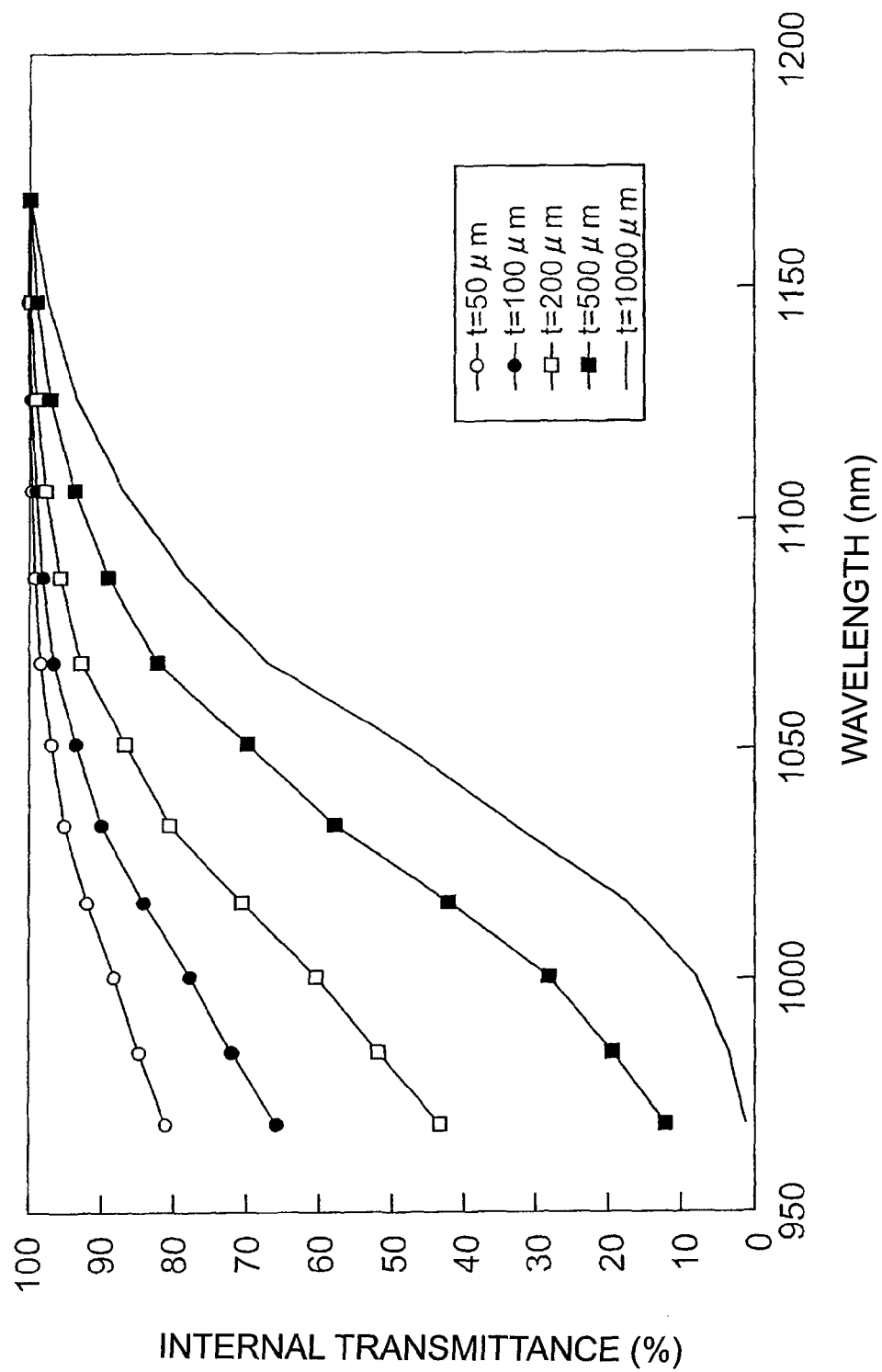
FIG. 13 is a graph showing relationships between the laser light wavelength and the transmittance within a silicon substrate in the laser processing method in accordance with the embodiment.
Figure 14:
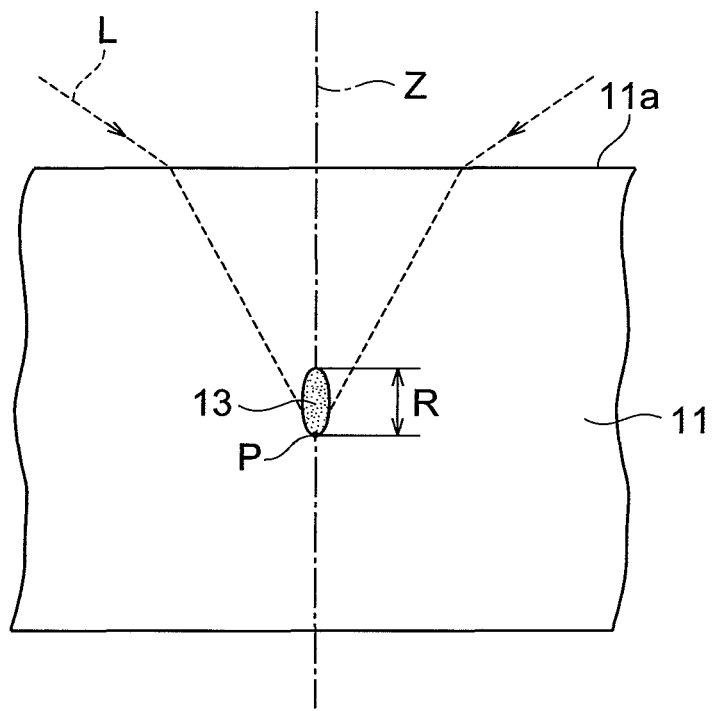
FIG. 14 is a view for explaining a principle of the laser processing method in accordance with the embodiment.

The fact that the molten processed region 13 is formed by multiphoton absorption will now be explained. FIG. 13 is a graph showing relationships between the laser light wavelength and the transmittance within the silicon substrate. Here, the respective reflected components on the front and rear face sides of the silicon substrate are eliminated, so as to show the internal transmittance alone. The respective relationships are shown in the cases where the thickness t of the silicon substrate is 50 µm, 100 µm, 200 µm, 500 µm, and 1000 µm.

For example, at the Nd:YAG laser wavelength of 1064 nm, the laser light appears to be transmitted through the silicon substrate by at least 80% when the silicon substrate has a thickness of 500 µm or less. Since the silicon wafer 11 shown in FIG. 12 has a thickness of 350 µm, the molten processed region 13 caused by multiphoton absorption is formed near the center of the silicon wafer 11, i.e., at a part distanced from the front face by 175 µm. The transmittance in this case is 90% or more with reference to a silicon wafer having a thickness of 200 µm, whereby the laser light is absorbed only slightly within the silicon wafer 11 but is substantially transmitted therethrough. This means that the molten processed region 13 is formed by multiphoton absorption. The forming of a molten processed region by multiphoton absorption is disclosed, for example, in "Ultrashort Pulse Laser Microprocessing of Silicon", Preprints of the National Meetings of Japan Welding Society, Vol. 66 (April, 2000), pp. 72-73.

A fracture is generated in a silicon wafer from a starting point region for cutting formed by a molten processed region, acting as a start point, in a cross-sectional direction, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the starting point region for cutting to the front and rear faces of the silicon wafer encompasses a case where the fracture grows from a state in which the molten processed region forming the starting point region for cutting is molten and a case where the fracture grows when the molten processed region forming the starting point region for cutting is re-solidified from the molten state. In either case, the molten processed region is formed only within the silicon wafer, and thus is present only within the cut section after cutting as shown in FIG. 12. When a starting point region for cutting is thus formed within the object by a molten processed region, unnecessary fractures deviating from a starting point region for cutting line are harder to occur at the time of cleaving, whereby cleavage control becomes easier. The molten processed region is formed not only by multiphoton absorption but also by other absorbing actions.

(3) Case where the Modified Region is a Refractive Index Change Region

An object to be processed (e.g., glass) is irradiated with laser light while locating a converging point within the object under a condition with a field intensity of at least $1\times10^8$ (W/cm$^2$) at the converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is $1\times10^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (November, 1997), pp. 105-111.

Though the cases of (1) to (3) are explained in the foregoing as modified regions, forming starting point regions for cutting as follows in view of the crystal structure of a wafer-like object to be processed, its cleavage characteristics, and the like makes it possible to cut the object with a smaller force and favorable accuracy from the starting point regions for cutting.

The laser processing method in accordance with the embodiment will now be explained.

When the laser light L transmissible through the silicon wafer 11 is pulse-oscillated under the conditions set forth in "(2) Case where the modified region is a molten processed region" mentioned above while locating the converging point P within the silicon wafer 11, a high temperature is locally attained at the converging point P. The absorption coefficient depends on temperature and thus rises at the converging point P, whereby the laser light L begins to be absorbed. This reduces the laser light L advancing to the opposite side of the converging point P from the laser light entrance surface 11a of the silicon wafer 11, whereby the part on the laser light entrance surface 11a side of the converging point P locally attains a high temperature along the optical axis Z of the laser light L. As a result, the absorption coefficient depending on temperature rises in this part, so that the laser light L is absorbed, whereby the temperature in this part exceeds its melting point, thus forming the molten processed region 13. Namely, the molten processed region is formed not only by the multiphoton absorption of the laser light L, but also by the absorption of laser light L resulting from the dependence of absorption coefficient on temperature. In actual processing, phenomena such as the processing by laser light absorption due to the dependence of absorption coefficient on temperature and the processing by multiphoton absorption are assumed to overlap each other. By irradiating a semiconductor material such as silicon with laser light under a condition with a field intensity of at least $1 \times 10^8$ (W/cm$^2$) at the converging point therewithin and a pulse width of 1 μs or less, a modified region including a molten processed region can be formed as set forth in "(2) Case where the modified region is a molten processed region" mentioned above.

Figure 15:
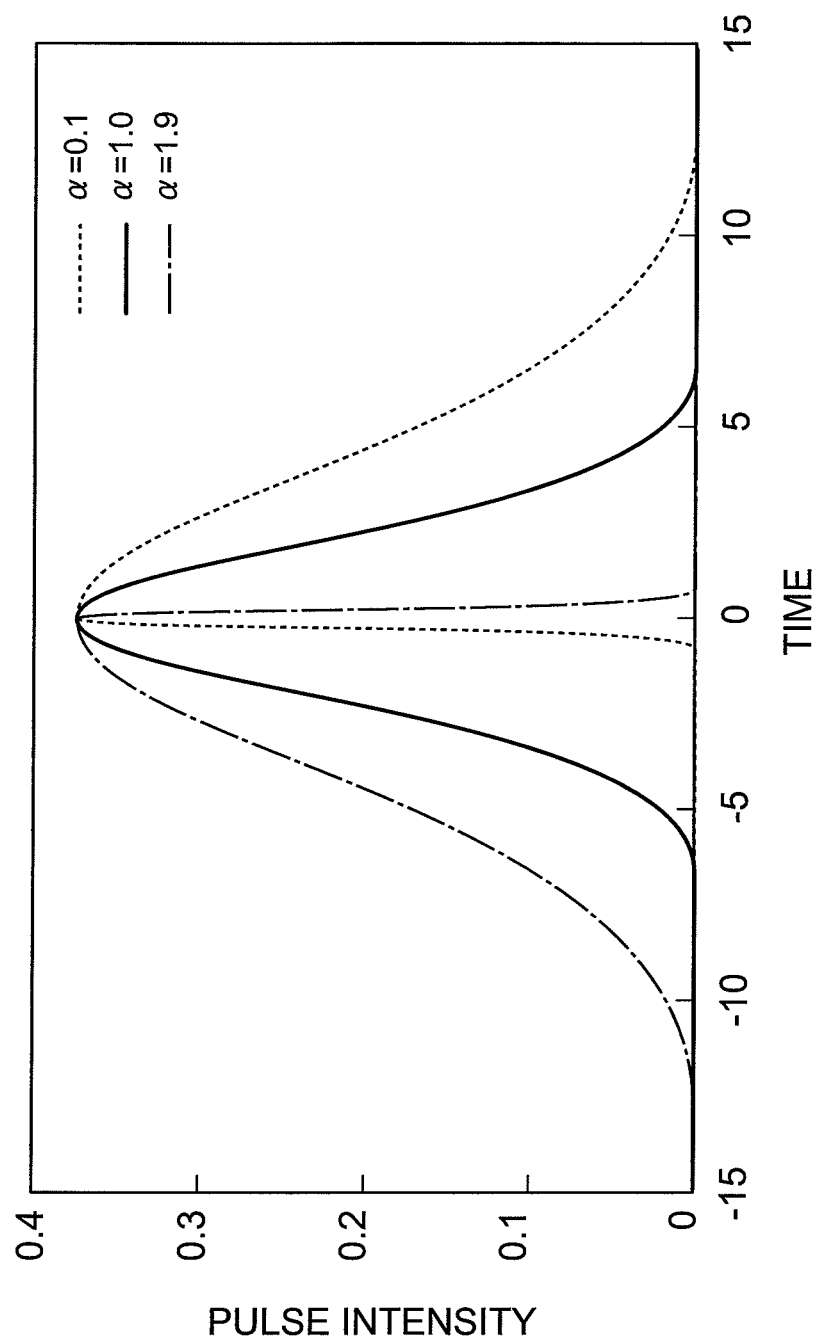
FIG. 15 is a graph showing relationships between time and pulse intensity in the laser processing method in accordance with the embodiment.

The length R in the optical axis Z direction of the part where the temperature exceeds the melting point by the absorption of laser light L is referred to as "area exceeding the melting point". As an index for the pulse waveform of laser light L, a waveform based on a Gaussian beam profile of laser light as shown in FIG. 15 is considered. Letting α be the degree of deformation of the Gaussian beam profile, α=1 in the Gaussian beam profile. When α is smaller than 1, it yields a beam profile whose peak position is advanced from that in the case where α=1. When a is greater than 1, it yields a beam profile whose peak position is retarded from that in the case where α=1.

As shown in FIGS. 15 and 16, when the silicon wafer 11 was irradiated with the laser light L in respective cases with pulse waveforms where α=0.1, α=1.0, and α=1.9, the respective highest temperatures reached in the vicinity of the converging point P were 14500 K, 17000 K, and 9900 K, while the respective areas exceeding the melting point extended by 28.0 μm, 27.5 μm, and 27.0 μm. Here, the laser light irradiation conditions were a scan rate of 300 mm/s, a repetition frequency of 80 kHz, a pulse width of 150 nm, and a pulse energy of 6.5 μJ. While these values were determined by simulations, multiphoton absorption phenomena are hard to be reflected in results of simulations and thus are not taken into consideration. Therefore, actual processing is not limited by the foregoing values.

In general, the highest temperature reached in the vicinity of the converging point P becomes higher when irradiated with the laser light with a pulse waveform in which 0.7≤α≤1.3 (hereinafter referred to as "standard pulse waveform") than with a pulse waveform in which α<0.7 (hereinafter referred to as "advanced pulse waveform") or a pulse waveform in which α>1.3 (hereinafter referred to as "retarded pulse waveform"). This yields a steeper temperature gradient to the surroundings, so that a long fracture is easier to occur in the thickness direction of the silicon wafer 11 from the molten processed region 13.

On the other hand, the area exceeding the melting point becomes greater when irradiated with the laser light L with the advanced pulse waveform than with the standard pulse waveform or the retarded pulse waveform. This increases the size of the molten processed region 13 (specifically the size in the thickness direction of the silicon wafer 11).

In contrast, the highest temperature reached in the vicinity of the converging point P becomes lower while the area exceeding the melting point becomes smaller when irradiated with the laser light L with the retarded pulse waveform than with the standard pulse waveform or the advanced pulse waveform. These make it harder to generate fractures in the thickness direction of the silicon wafer 11 from the molten processed region 13 and reduce the size of the molten processed region 13.

Figure 17:
FIG. 17 is a view showing photographs of a cut section of a silicon wafer cut by the laser processing method in accordance with the embodiment, in which (a) and (b) refer to cases irradiated with laser light with pulse waveforms where $\alpha=0.34$ and $\alpha=0.76$, respectively.
Figure 17:
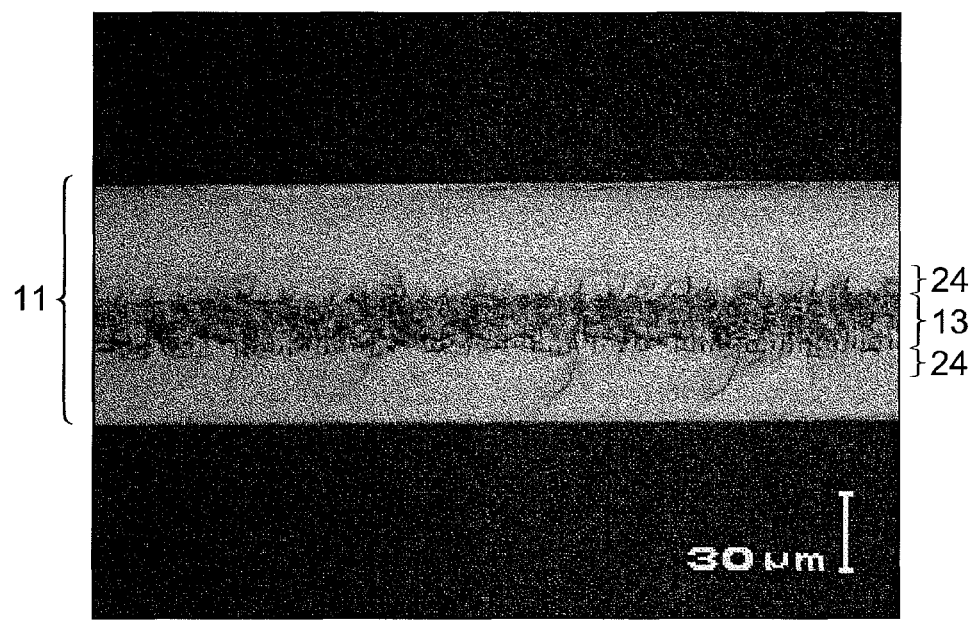

FIG. 17 is a view showing photographs of a cut section of the silicon wafer 11 cut by the laser processing method in accordance with the embodiment, in which (a) and (b) refer to cases irradiated with the laser light L with pulse waveforms where α=0.34 and α=0.76, respectively. The size of the molten processed region 13 is seen to be greater when irradiated with the laser light L with the pulse waveform where α=0.34 (i.e., advanced pulse waveform) ((a) in the drawing) than with the pulse waveform where α=0.76 (i.e., standard pulse waveform) ((b) in the drawing). It is also seen that longer fractures 24 occur in the thickness direction of the silicon wafer 11 from the molten processed region 13 when irradiated with the laser light L with the pulse waveform where α=0.76 (i.e., standard pulse waveform) ((b) in the drawing) than with the pulse waveform where α=0.34 (i.e., advanced pulse waveform) ((a) in the drawing).

Cutting of the planar object 1 by the laser processing method in accordance with the embodiment will now be explained.

Figure 18:
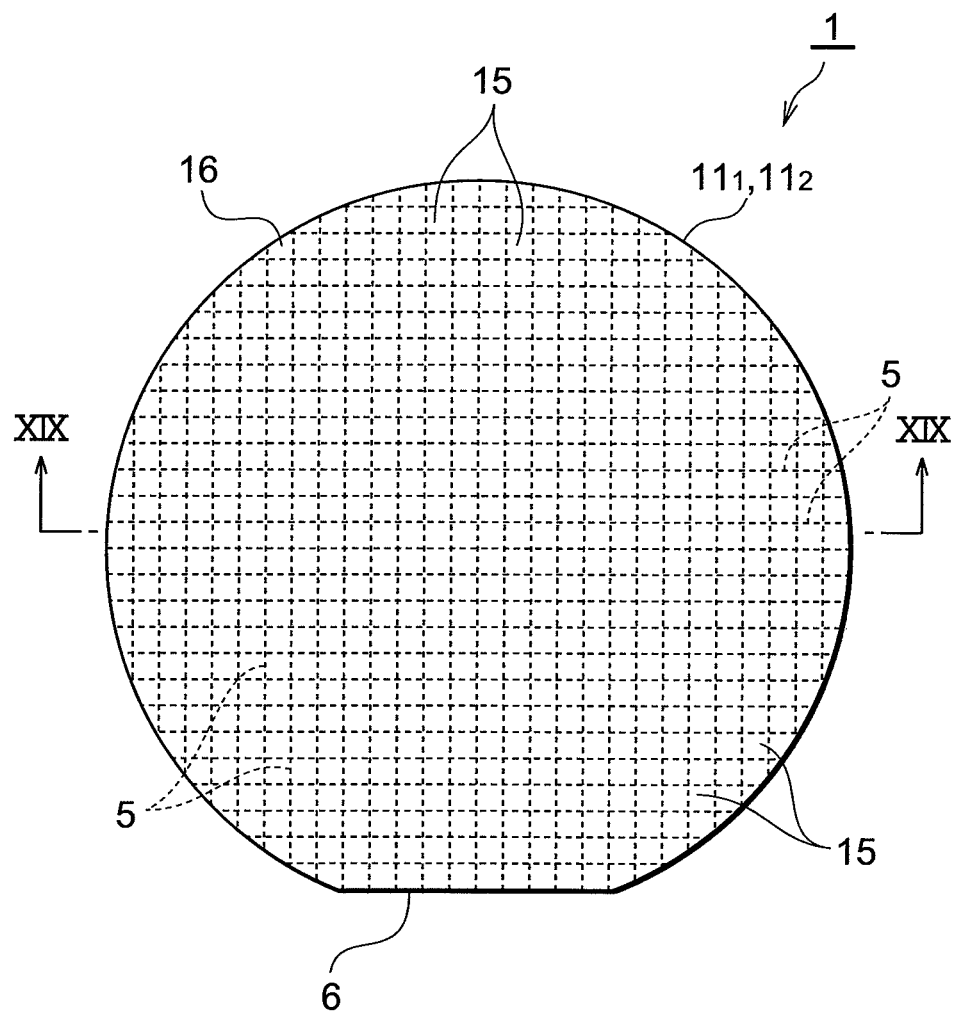
FIG. 18 is a plan view of the object to be processed by the laser processing method in accordance with the embodiment.
Figure 19:
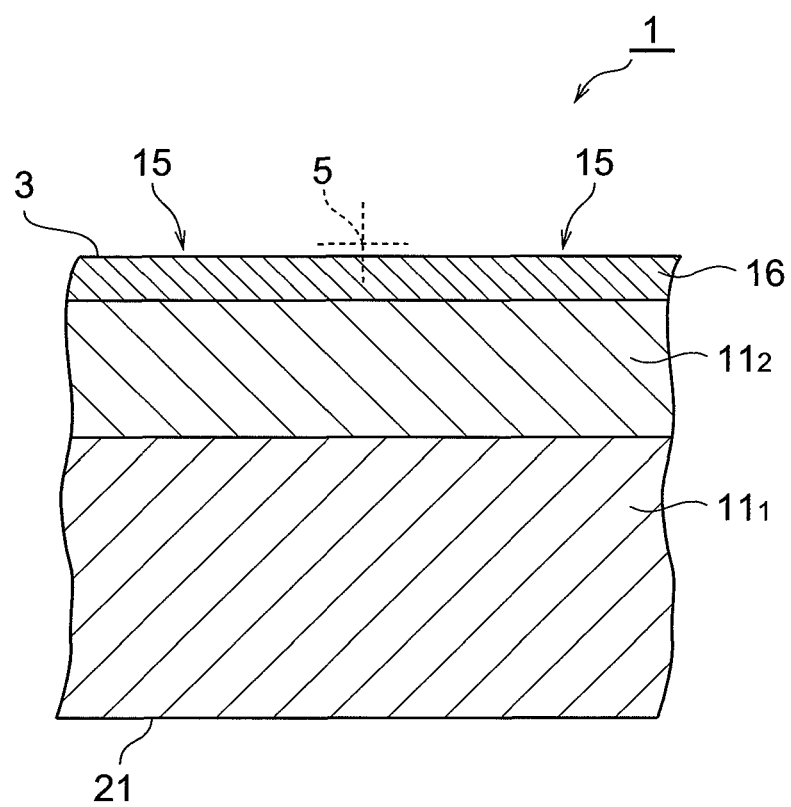
FIG. 19 is a partial sectional view taken along the line XIX-XIX of FIG. 18.

As shown in FIGS. 18 and 19, the object 1 comprises a silicon wafer $11_1$ having a thickness of 100 μm, a silicon wafer $11_2$ having a thickness of 50 μm overlaid on the silicon wafer $11_1$, and a functional device layer 16 formed on the silicon wafer $11_2$ while including a plurality of functional devices 15. A number of functional devices 15, examples of which include semiconductor operating layers formed by crystal growth, light-receiving devices such as laser diodes, and circuit devices formed as circuits, are formed like a matrix in directions parallel and perpendicular to an orientation flat 6 of the silicon wafers $11_1$, $11_2$.

Figure 20:
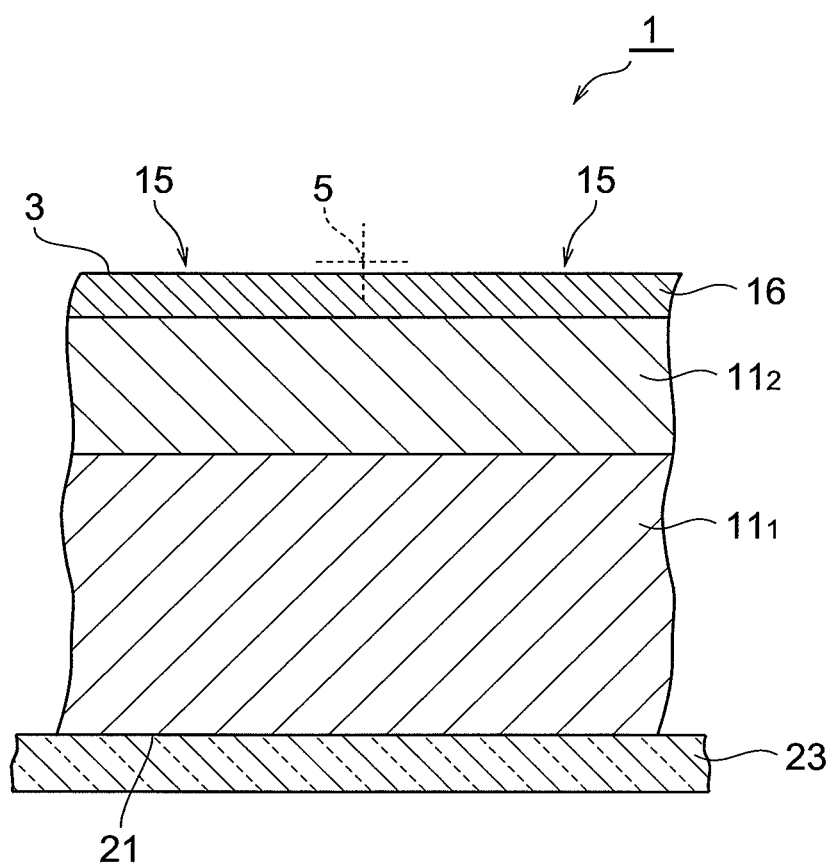
FIG. 20 is a partial sectional view of the object for explaining the laser processing method in accordance with the embodiment, illustrating a state where an expandable tape is attached to the object.

Thus constructed object 1 is cut into the functional devices 15. First, as shown in FIG. 20, an expandable tape 23 is attached to the rear face 21 of the object 1, and the object 1 is secured onto a mount table (not depicted) of a laser processing apparatus such that the functional device layer 16 faces up.

Figure 21:
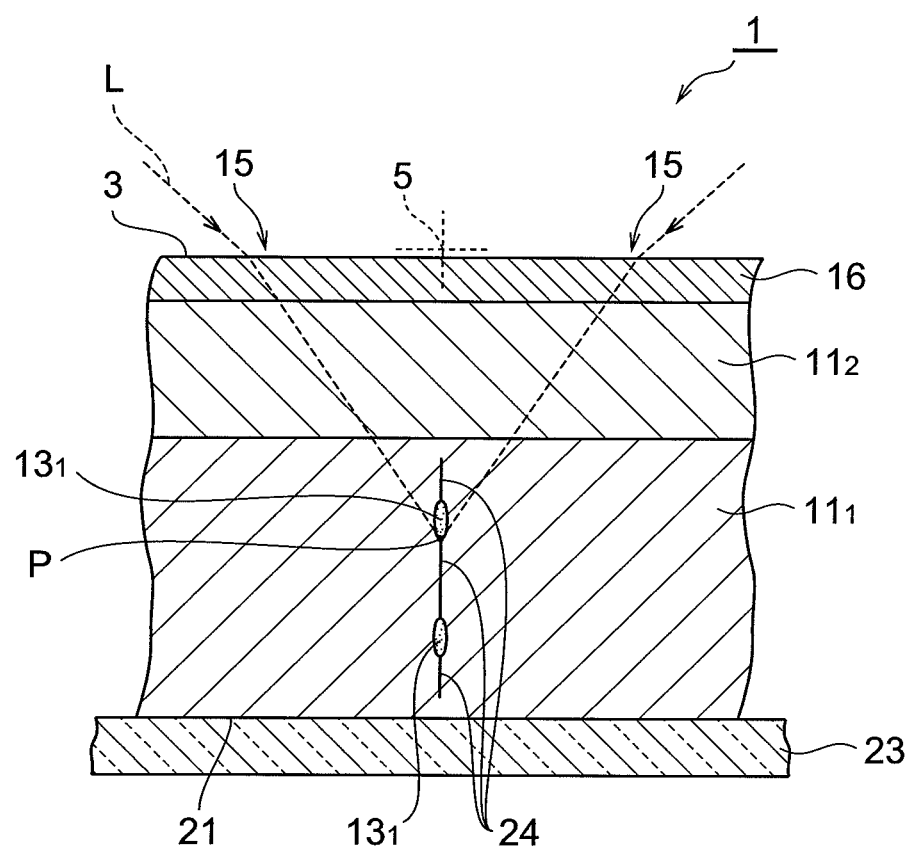
FIG. 21 is a partial sectional view of the object for explaining the laser processing method in accordance with the embodiment, illustrating a first state of irradiating the object with laser light.

Subsequently, as shown in FIG. 21, the laser light L with a standard pulse waveform is pulse-oscillated while using the front face 3 of the object 1 as the laser light entrance surface and locating the converging point P within the silicon wafer $11_1$, and the mount table is moved, so as to scan the converging point P along lines to cut 5 which are set like grids (see broken lines in FIG. 18) passing between the adjacent functional devices 15, 15. In the silicon wafer $11_1$, the converging point P is scanned along each line to cut 5 twice while being located at respective positions differently distanced from the front face 3, so as to form two rows of molten processed regions $13_1$ within the silicon wafer $11_1$ one by one along the line to cut 5 successively from the rear face 21 side.

Figure 22:
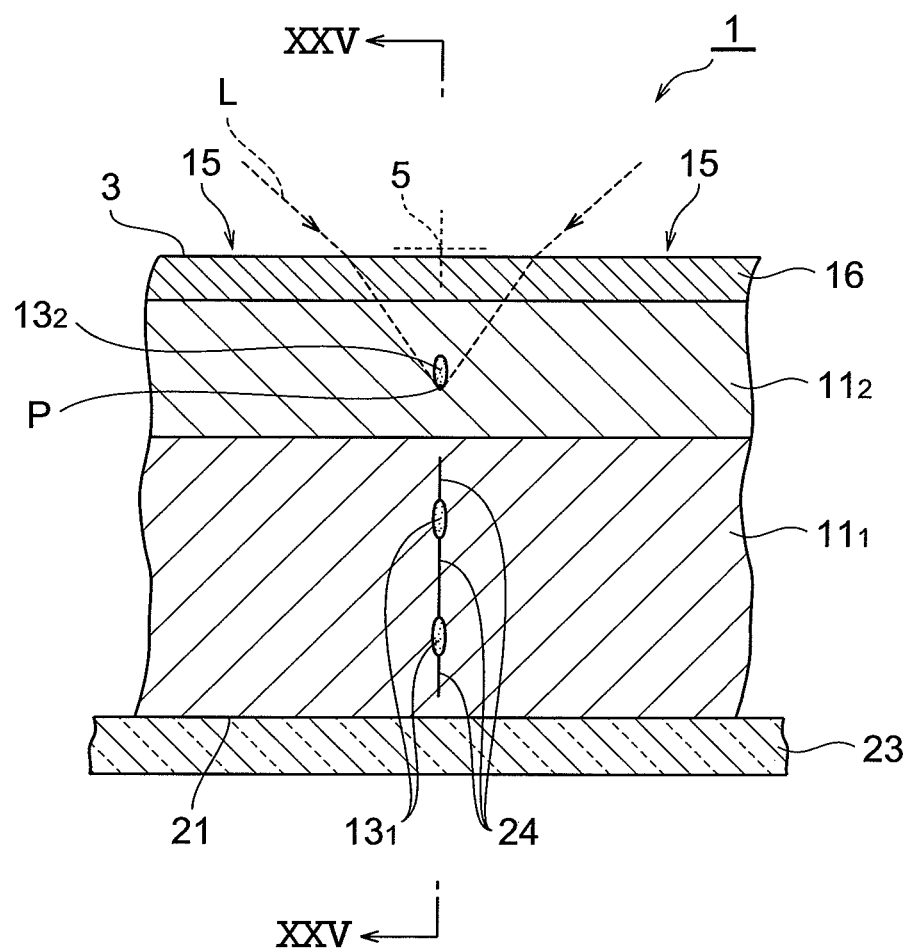
FIG. 22 is a partial sectional view of the object for explaining the laser processing method in accordance with the embodiment, illustrating a second state of irradiating the object with laser light.

Next, as shown in FIG. 22, the laser light L with a retarded pulse waveform is pulse-oscillated while using the front face 3 of the object 1 as the laser light entrance surface and locating the converging point P within the silicon wafer $11_2$, and the mount table is moved, so as to scan the converging point P along the lines to cut 5. In the silicon wafer $11_2$, the converging point P is scanned along each line to cut 5 once, so as to form one row of a molten processed region $13_2$ within the silicon wafer $11_2$ along the line to cut 5.

Figure 25:
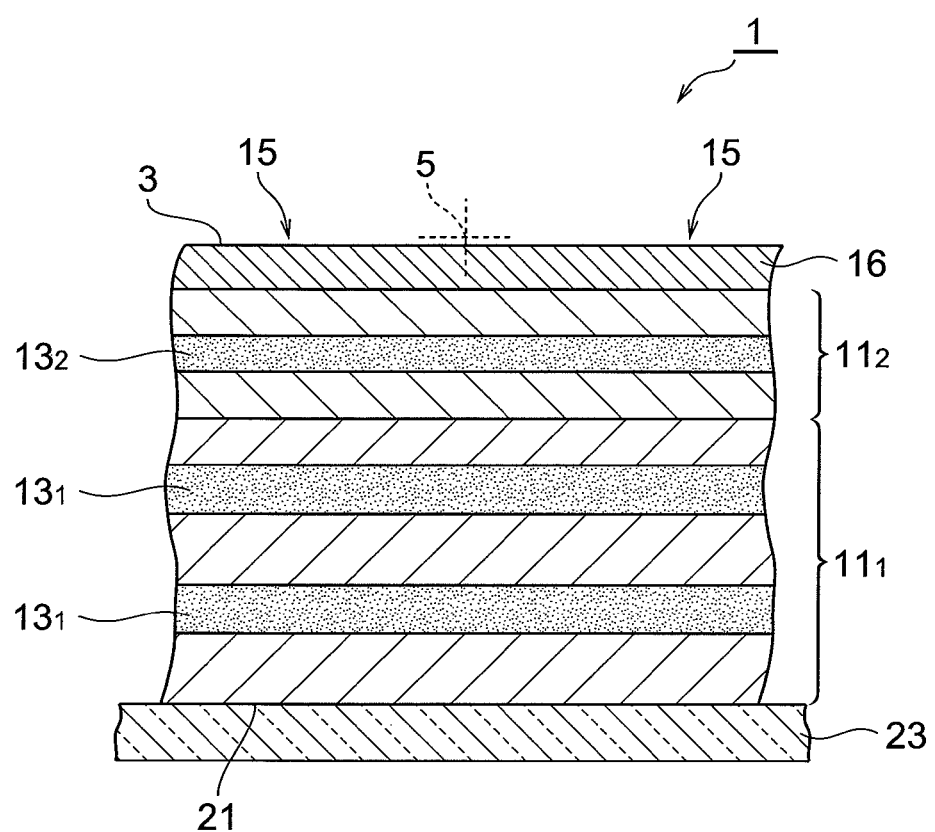
FIG. 25 is a partial sectional view taken along the line XXV-XXV of FIG. 22.

As shown in FIGS. 22 and 25, the molten processed regions $13_1$ within the silicon wafer $11_1$ are formed by irradiation with the laser light L with the standard pulse waveform and thus are greater in the thickness direction of the object 1 than the molten processed region $13_2$ within the silicon wafer $11_2$ formed by irradiation with the laser light L with the retarded pulse waveform, while generating fractures 24 in the thickness direction of the object 1. The molten processed regions $13_1$, $13_2$ may include cracks mixed therein.

Figure 23:
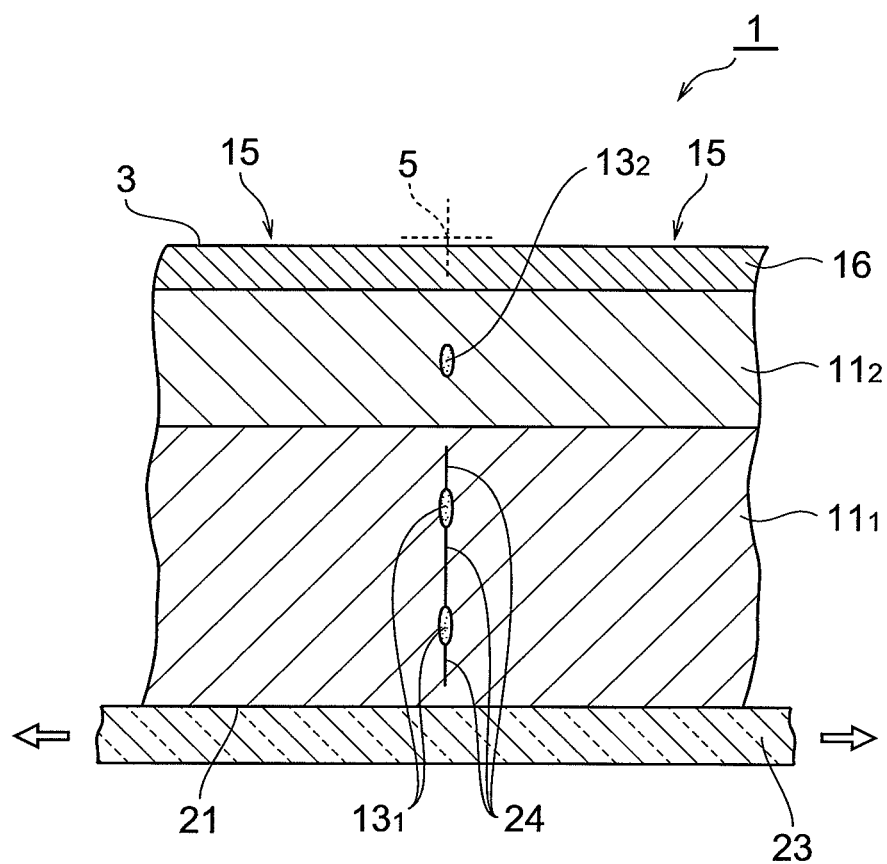
FIG. 23 is a partial sectional view of the object for explaining the laser processing method in accordance with the embodiment, illustrating a state where the expandable tape is expanded.
Figure 24:
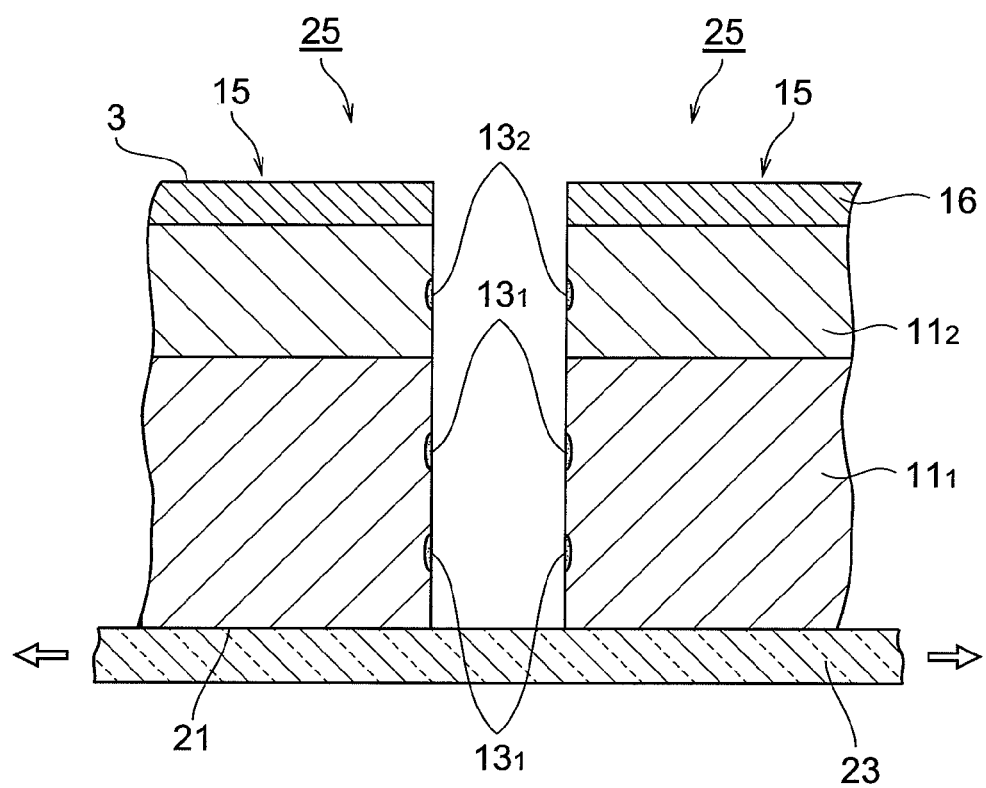
FIG. 24 is a partial sectional view of the object for explaining the laser processing method in accordance with the embodiment, illustrating a state where the object is cut into semiconductor chips.

Subsequently, the expandable tape 23 is expanded as shown in FIG. 23, so as to cut the object 1 along the lines to cut 5 from the molten processed regions $13_1$, $13_2$ acting as cutting start points, and a plurality of semiconductor chips 25 obtained by the cutting are separated from each other.

As explained in the foregoing, the laser processing method in accordance with this embodiment can form the molten processed regions $13_1$, which have a larger size in the thickness direction of the object 1 and are easy to generate the fractures 24 in the thickness direction of the object 1, within the silicon wafer $11_1$ by irradiation with the laser light L with the standard pulse waveform, and form the molten processed region $13_2$, which has a smaller size and is hard to generate the fractures 24 in the thickness direction of the object 1, within the silicon wafer $11_2$ by irradiation with the laser light L with the retarded pulse waveform. When the pulse waveform of the laser light L is thus changed according to the structure of the object 1 and the like, so as to form the molten processed regions $13_1$, $13_2$ of different types within the object 1, the object 1 can accurately be cut along the lines to cut 5 from the molten processed regions $13_1$, $13_2$ acting as cutting start points.

When the object 1 includes a silicon wafer $11_3$ having a thickness of 120 μm, it may be irradiated with the laser light L with an advanced waveform, so as to form a molten processed region $13_3$ having a further larger size in the thickness direction of the object 1 within the silicon wafer $11_3$, whereby the object 1 can accurately be cut along the lines to cut 5.

The laser processing apparatus in accordance with the embodiment will now be explained.

Figure 26:
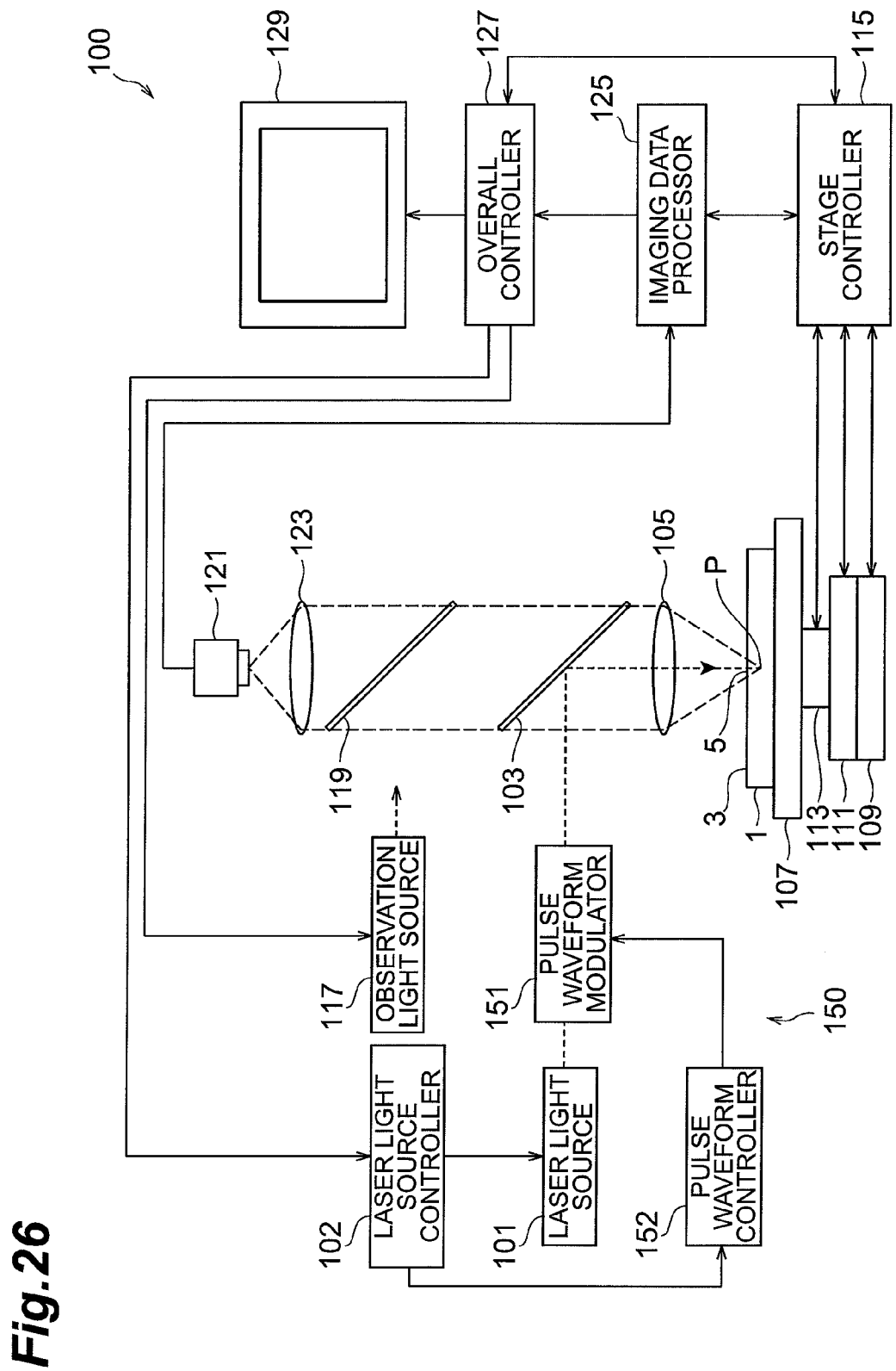
FIG. 26 is a diagram showing the laser processing apparatus in accordance with an embodiment.

As shown in FIG. 26, the laser processing apparatus 100, which forms the modified region 7 to become a cutting start point within the planar object 1, comprises a laser light source 101 for pulse-oscillating the laser light L, a laser light source controller 102 for controlling the laser light 101 in order to regulate the output, pulse width, and the like of the laser light L, a dichroic mirror 103 which functions to reflect the laser light L and is arranged such as to change the direction of the optical axis of the laser light L by 90°, and a condenser lens 105 which converges the laser light reflected by the dichroic mirror 103 into the object 1 and forms the modified region 7 at the converging point P of the laser light L.

The laser processing apparatus 100 further comprises a mount table 107 for mounting the object 1 irradiated with the laser light L converged by the condenser lens 105; an X-axis stage 109 for moving the mount table 107 along the X axis; a Y-axis stage 111 for moving the mount table 107 along the Y axis orthogonal to the X axis; and a Z-axis stage 113 for moving the mount table 107 along the Z axis orthogonal to the X and Y axes; and a stage controller 115 for regulating movements of the three stages 109, 111, 113.

The movement of the converging point P along the X (Y) axis is effected by causing the X(Y)-axis stage 109 (111) to move the object 1 along the X (Y) axis. The Z axis is orthogonal to the front face 3 of the object 1, and thus is a direction of focal depth of the laser light L incident on the object 1. Therefore, moving the Z-axis stage 113 along the Z axis can locate the converging point P of the laser light L at a desirable position within the object 1.

The laser light source 101 is an Nd:YAG laser which generates pulsed laser light. Other examples of lasers usable in the laser light source 101 include $Nd:YVO_4$, Nd:YLF, and titanium sapphire lasers.

The laser processing apparatus 100 further comprises an observation light source 117 which generates visible rays for illuminating the object 1 mounted on the mount table 107 and a beam splitter 119, arranged on the same optical axis as with the dichroic mirror 103 and condenser lens 105, for the visible rays. The dichroic mirror 103 is arranged between the beam splitter 119 and the condenser lens 105. The beam splitter 119 functions to reflect about a half of the visible rays and transmit the remaining half therethrough, and is arranged so as to change the direction of the optical axis of the visible rays by 90°. The beam splitter 119 reflects about a half of the visible rays generated from the observation light source 117, while thus reflected visible rays pass through the dichroic mirror 103 and condenser lens 105, thereby illuminating the front face 3 of the object 1 including the lines to cut 5 and the like.

The laser processing apparatus 100 further comprises an image pickup device 121 and an imaging lens 123 arranged on the same optical axis as with the beam splitter 119, dichroic mirror 103, and condenser lens 105. An example of the image pickup device 121 is a CCD camera. The reflected light of visible rays having illuminated the front face 3 including the lines to cut 5 and the like passes through the condenser lens 105, dichroic mirror 103, and beam splitter 119, so as to be converged by the imaging lens 123, and thus formed image is captured by the image pickup device 121, so as to become imaging data.

The laser processing apparatus 100 further comprises an imaging data processor 125 for inputting the imaging data outputted from the image pickup device 121, an overall controller 127 for controlling the laser processing apparatus 100 as a whole, and a monitor 129. According to the imaging data, the imaging data processor 125 calculates focus data for positioning the focal point of visible rays generated by the observation light source 129 onto the front face 3 of the object 1. According to the focus data, the stage controller 115 regulates the movement of the Z-axis stage 113 so as to position the focal point of visible rays at the front face 3 of the object 1. Thus, the imaging data processor 125 functions as an autofocus unit. The imaging data processor 125 calculates image data such as enlarged images of the front face 3 according to the imaging data. The image data is sent to the overall controller 127, so as to be subjected to various processes therein. Thus processed data is sent to the monitor 129. As a consequence, enlarged images and the like are displayed on the monitor 129.

The overall controller 127 is fed with data from the stage controller 115, the image data from the imaging data processor 125, and the like, and controls the laser processing apparatus 100 as a whole by regulating the laser light source controller 102, observation light source 117, and stage controller 115 according to these data as well. Thus, the overall controller 127 functions as a computer unit.

The laser processing apparatus 100 further comprises a pulse waveform changing means 150 for changing the pulse waveform of the laser light L pulse-oscillated by the laser light source 101. The pulse waveform changing means 150 is constructed as follows, for example. Namely, the pulse waveform changing means 150 has a pulse waveform modulator 151 such as EO modulator, for example, and a pulse waveform controller 152 for controlling the pulse waveform modulator 151 by a signal from the laser light source controller 102. For irradiation with the laser light L with the standard pulse waveform, the laser light L emitted from the laser light source 101 is transmitted through the pulse waveform modulator 151 while keeping the pulse waveform as it is. For irradiation with the laser light L with the advanced pulse waveform, the pulse waveform controller 152 retards the timing of freeing the pulse waveform modulator 151 with respect to the laser emission start time. For irradiation with the laser light L with the retarded pulse waveform, the pulse waveform modulator 151 is freed before the laser emission start time and being closed during the laser pulse irradiation. Other methods of controlling the pulse waveform include (1) one using two lasers and overlaying them on each other at timings changed according to pulse waveforms to be made and (2) one providing lasers for emitting respective pulse waveforms. The method (2) can be realized, for example, by using Nd:YAG and $Nd:YVO_4$ lasers for the standard and advanced waveforms, respectively.

Thus constructed laser processing apparatus 100 can reliably form the modified regions 7 of different types within a single object 1, since the pulse waveform changing means 150 can change the pulse waveform of the laser light L pulse-oscillated by the laser light source 101.

The present invention is not limited to the above-mentioned embodiments.

For example, though the object 1 has a substantially fixed thickness along the lines to cut 5, the pulse waveform of the irradiating laser light L may be changed somewhere in the lines to cut 5 if the thickness of the object 1 changes along the lines to cut 5.

When the thickness of the object 1 varies between a part extending along a line to cut $5_1$ and a part extending along a line to cut $5_2$, the pulse waveform of the irradiating laser light L may be changed therebetween, so as to form a modified region $7_1$ in the part extending along the line to cut $5_1$, and a modified region $7_2$ whose type differs from that of the modified region $7_1$ in the part extending along the line to cut $5_2$. As a consequence, the object 1 can accurately be cut along the lines to cut $5_1$, $5_2$ from the modified regions $7_1$, $7_2$ acting as cutting start points. The lines to cut $5_1$, $5_2$ may intersect, e.g., so as to be substantially perpendicular to each other, or not.

When the thickness of the object 1 is less than 100 μm, the object 1 is preferably irradiated with the laser light L with the retarded pulse waveform along the lines to cut 5. This enables processing without damages (molten marks) to the front face 3 and rear face 21 of the object 1.

When the object 1 is a (111) wafer, (110) wafer, (100) 45°-rotated wafer, or the like, in which the cleavage direction of the object 1 and the direction of the line to cut 5 in the object 1 do not align with each other, the line to cut 5 not aligning with the cleavage direction is preferably irradiated with the laser light L with the advanced pulse waveform. This increases the size of the modified region 7 (specifically the size in the thickness direction of the object 1), whereby the object 1 can accurately be cut along the line to cut 5 against the cleavage direction.

When the object 1 is an off-angle wafer or the like, in which the direction of the cleavage plane of the object 1 does not align with the thickness direction thereof, the object 1 is also preferably irradiated with the laser light L with the advanced pulse waveform. This increases the size of the modified region 7 (specifically the size in the thickness direction of the object 1), whereby the object 1 can accurately be cut in the thickness direction thereof.

Though the front face 3 of the object 1 is the laser light entrance surface in the above-mentioned embodiments, the rear face 21 of the object 1 may be the laser light entrance surface.

Though the molten processed regions 13 are formed within the silicon wafer 11 in the above-mentioned embodiments, other modified regions 7 such as crack regions and refractive index change regions may be formed within the object 1 made of other materials such as glass and dielectric materials.

INDUSTRIAL APPLICABILITY

The present invention can reliably form modified regions whose types differ from each other within a single object to be processed.

The invention claimed is:

1. A laser processing method comprising the steps of:
    irradiating a planar object to be processed with laser light having a first pulse waveform while locating a converging point within the object at a first position separated by a first distance in a thickness direction of the object from a laser light entrance surface of the object, so as to form a first modified region to become a cutting start point within the object along a line to cut the object; and
    after irradiating the object with laser light having the first pulse waveform, irradiating the object with laser light having a second pulse waveform while locating a converging point within the object at a second position separated by a second distance in the thickness direction of the object from the laser light entrance surface, so as to form a second modified region to become a cutting start point within the object along the line to cut,
    wherein the first pulse waveform and the second pulse waveform are pulse intensity waveforms with respect to time, the second pulse waveform being different than the first pulse waveform, and a wavelength of the first pulse waveform and a wavelength of the second pulse waveform are identical wavelengths; and
    wherein a degree of deformation for the first pulse waveform and a degree of deformation for the second pulse waveform differ from one another, and at least one of the first pulse waveform and the second pulse waveform has a peak position with an advanced or a retarded pulse waveform relative to a standard pulse waveform.

2. A laser processing method according to claim 1, wherein the object is cut along the line to cut from the first and second modified regions acting as cutting start points.

3. A laser processing method comprising the steps of:
    irradiating a planar object to be processed with laser light having a first pulse waveform while locating a converging point within the object, so as to form a first modified region to become a cutting start point within the object along a first line to cut the object; and
    after irradiating the object with laser light having the first pulse waveform, irradiating the object with laser light having a second pulse waveform while locating a converging point within the object, so as to form a second modified region to become a cutting start point within the object along a second line to cut the object,
    wherein the first pulse waveform and the second pulse waveform are pulse intensity waveforms with respect to time, the second pulse waveform being different than the first pulse waveform, and a wavelength of the first pulse waveform and a wavelength of the second pulse waveform are identical wavelengths; and
    wherein a degree of deformation for the first pulse waveform and a degree of deformation for the second pulse waveform differ from one another, and at least one of the first pulse waveform and the second pulse waveform has a peak position with an advanced or a retarded pulse waveform relative to a standard pulse waveform.

4. A laser processing method according to claim 3, wherein the first and second lines to cut intersect each other.

5. A laser processing method according to claim 3, wherein the object is cut along the first and second lines to cut from the first and second modified regions acting as cutting start points.

6. A laser processing apparatus for forming a modified region to become a cutting start point within a planar object to be processed, the apparatus comprising:
    a mount table for mounting the object;
    a laser light source for pulse-oscillating laser light;
    pulse waveform changing means for changing a pulse waveform of the laser light pulse-oscillated by the laser light source from a first pulse waveform to a second pulse waveform, the first pulse waveform and the second pulse waveform being pulse intensity waveforms with respect to time, the second pulse waveform being different than the first pulse waveform, a wavelength of the first pulse waveform and a wavelength of the second pulse waveform being identical wavelengths, a degree of deformation for the first pulse waveform and a degree of deformation for the second pulse waveform differing from one another, and at least one of the first pulse waveform and the second pulse waveform having a peak position with an advanced or a retarded pulse waveform relative to a standard pulse waveform a condenser lens for converging the laser light pulse-oscillated by the laser light source into the object mounted on the mount table and forming the modified region at a converging point of the laser light.

* * * * *